US006652688B2

(12) United States Patent
Matsumura et al.

(10) Patent No.: US 6,652,688 B2
(45) Date of Patent: Nov. 25, 2003

(54) PROCESS FOR PRODUCING SEMICONDUCTOR WAFER WITH ADHESIVE FILM

(75) Inventors: Akiko Matsumura, Ibaraki (JP); Yuji Hotta, Ibaraki (JP); Sadahito Misumi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/176,530

(22) Filed: Jun. 24, 2002

(65) Prior Publication Data

US 2003/0034128 A1 Feb. 20, 2003

(30) Foreign Application Priority Data

Jun. 22, 2001 (JP) .................................. P. 2001-189011
Apr. 25, 2002 (JP) .................................. P.2002-123903

(51) Int. Cl.[7] ........................... B32B 31/20; B32B 7/12; C09J 7/02; H01L 23/48; H01L 21/50
(52) U.S. Cl. .................... 156/64; 156/230; 156/247; 156/250; 156/289; 428/40.1; 428/343; 427/96; 29/740; 29/877; 257/780; 438/612
(58) Field of Search .................. 156/64, 230, 247, 156/250, 289, 330.9, 272.2, 273.5, 273.9; 428/40.1, 42.2, 42.3, 343, 344, 346, 914; 427/96, 147, 148; 171/54, 258; 29/740, 840, 877; 257/690, 780; 438/113, 114, 612

(56) References Cited

U.S. PATENT DOCUMENTS

| 5,814,401 A | * | 9/1998 | Gamota et al. .............. 428/343 |
| 6,221,691 B1 | * | 4/2001 | Schrock ....................... 438/106 |
| 6,323,062 B1 | * | 11/2001 | Gilleo et al. ................. 438/114 |
| 6,352,881 B1 | * | 3/2002 | Nguyen et al. .............. 438/108 |

FOREIGN PATENT DOCUMENTS

JP       2002-203874    *   7/2002    ........... H01L/21/60

* cited by examiner

*Primary Examiner*—Jerry A. Lorengo
(74) *Attorney, Agent, or Firm*—Sughrue Mion, PLLC

(57) ABSTRACT

A process for producing a semiconductor wafer having an adhesive film, by adhering an adhesive film onto a bump-formed surface of a semiconductor wafer having formed thereon bumps with a predetermined arrangement, which comprises: determining a particular arrangement axis direction in which intervals between adjacent linear arrangement axes connecting the bumps becomes the shortest; and adhering the adhesive film in the direction substantially at a right angle with the determined arrangement axis direction, so as to markedly reduce voids included in the adhesion surface upon adhering an adhesive film such as underfill onto a semiconductor wafer.

10 Claims, 2 Drawing Sheets

ADHERING DIRECTION

ADHERING DIRECTION
( ADHERING DIRECTION IS DETERMINED
DEPENDING ON BUMP ARRANGEMENT)

PERIHERAL BUMP

ADHERING DIRECTION

AREA BUMP
(NORMAL LATTICE ARRANGEMENT)

ADHERING DIRECTION

AREA BUMP
(ZIGZAG LATTICE ARRANGEMENT)

ADHERING DIRECTION $a = b$ : a OR b DIRECTION
$a < b$ : a DIRECTION

PROCESS FOR PRODUCING SEMICONDUCTOR WAFER WITH ADHESIVE FILM

BACKGROUND OF THE INVENTION

1. Field of the Invention

The present invention relates to a process for adhering an adhesive film onto a bump-formed side of a wafer having bump-formed thereon. The invention relates to a process for producing a semiconductor wafer having an adhesive film, which enables to minimize void inclusion upon production of the semiconductor wafer having the adhesive film. The invention relates to a process for producing a semiconductor device by mounting a semiconductor element (chip) on a wiring circuit board such as a mother board or a daughter board with a face-down structure, which comprises using an adhesive film for underfill adhered to the chip to seal (encapsulate).

2. Description of the Related Art

In recent years, a method has attracted attention which comprises mounting a chip of face-down structure onto a wiring circuit board such as a mother board or a daughter board having formed thereon a wiring circuit (flip-chip system, direct chip attach system, or the like) in order to more improve the performance of semiconductor devices. Conventional mounting methods involve various problems with respect to performance. For example, in case when a chip is mounted on a wiring circuit board in the form of being packaged in contact with a lead frame via a gold wire, there might arise delay of transmitting information due to wiring or information-transmitting errors due to cross talk.

In contrast, the aforesaid mounting method employing the face-down structure, in which a surface electrode of a chip is directly connected to a wiring circuit board, enables to reduce thickness and weight of a semiconductor device. However, in the mounting method according to the flip-chip system, a direct chip attach system, or the like having the above-described structure, a chip and a wiring circuit board different from each other in coefficient of linear expansion are directly electrically connected, and hence reliability of the connecting portion is of extreme importance.

Therefore, a liquid thermosetting resin, called underfill material, is injected into a gap between the chip and the wiring circuit board, and is cured to form a resin cured body which functions to disperse a stress which might otherwise be concentrated onto the electrically connecting portion, thus improvement of reliability on the connection being intended.

However, in order to inject the liquid thermosetting resin into a gap between the chip and the wiring circuit board, it is required to provide a space for disposing an injection nozzle at the periphery of a position where the chip is to be mounted. With the progress of reduction in size and thickness of a semiconductor device, it has become difficult to secure a space for disposing the injection nozzle, and hence it has been demanded to improve the step of injecting (forming an underfill) a liquid resin. Also, there is involved a problem that the time for the step is prolonged so as to inject the liquid resin for each chip.

In order to solve the problems, the inventors have formerly proposed a method of adhering an adhesive film for underfill to a semiconductor wafer before being cut into individual chips using a film-like adhesive for forming the underfill, then cutting into individual chip size (Japanese Patent Application No. 72074/2001) to there by greatly shorten the time for the step. However, generation of void is unavoidable in the actual step of adhering the adhesive film for underfill to the semiconductor wafer.

SUMMARY OF THE INVENTION

An object of the invention is to markedly reduce voids included in the adhesion layer upon adhering an adhesive film such as an underfill to a semiconductor wafer.

The invention provides a process for producing a semiconductor wafer having an adhesive film by adhering an adhesive film onto a bump-formed surface of a semiconductor water having formed thereon bumps with a predetermined arrangement, which comprises determining a particular arrangement axis direction in which intervals between adjacent linear arrangement axes connecting the bumps becomes the shortest, and adhering the adhesive film in the direction substantially at a right angle with the determined arrangement axis direction. That is, in the case of adhering an adhesive film onto a bump-formed surface of a semiconductor wafer provided with peripheral bumps, the semiconductor wafer with the adhesive film is produced by conducting the adhering in a direction at a right angle with the oblique side of a right triangle drawn by connecting the corner bump and two bumps adjacent thereto with respect to the outermost bump arrangement. Also, in the case of adhering an adhesive film onto a bump-formed surface of a semiconductor wafer provided with area bumps, the semiconductor water with the adhesive film is produced by conducting the adhering in a direction at a right angle with the oblique side of a right triangle drawn by connecting the corner bump and two bumps adjacent thereto with respect to the outermost bump arrangement. Additionally, with the normal lattice area bumps, the adhering direction can also be defined as a direction at a right angle with the oblique side of a right triangle drawn by connecting the corner bump and two bumps adjacent thereto with respect to the outermost bump arrangement. As a material for constituting the adhesive film to be used in the invention, thermosetting resin compositions are preferred, with a polycarbodiimide resin composition being particularly preferred. In addition, the invention also provides a process for producing a semiconductor device by mounting, after the above-described step, the semiconductor wafer on a wiring circuit board using the adhesive film as an unterfill.

Figure 1:
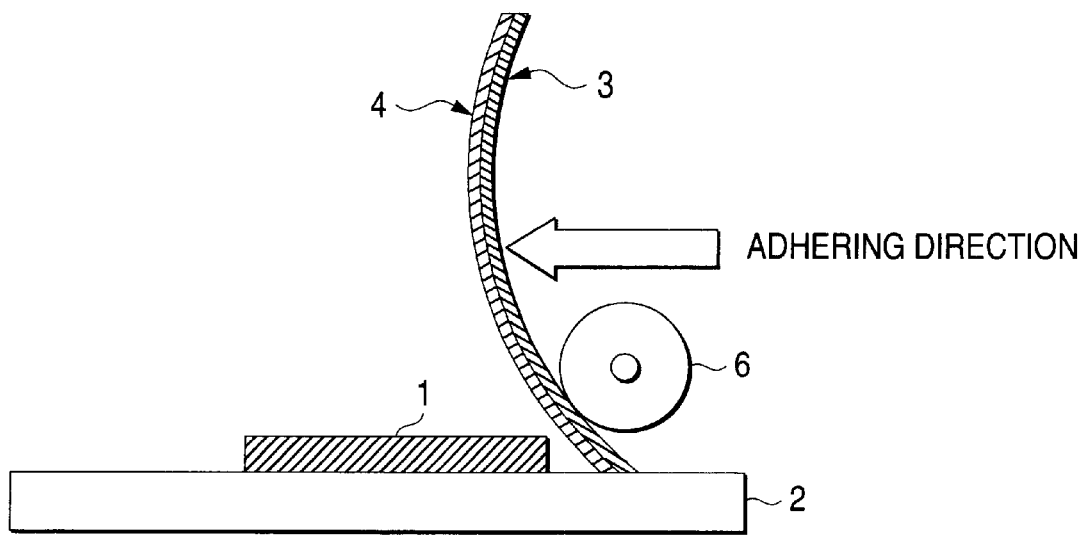
FIG. 1 is a side-view of an outline illustration showing the manner of adhering an adhesive film to a semiconductor wafer.

The reference numbers or signs used in the drawings are set forth below.

1: Semiconductor wafer
2: Hot plate
3: Separator
4: Adhesive film
5: Chip with bumps
6: Roller
7: Bump (Semiconductor Wafer)

The term "semiconductor wafer" as used herein in the invention commonly means a plate-like substance comprising a wafer (crystalline substrate) having formed thereon one or more element structures. The element structure is a kind of circuit constituted by a semiconductor crystal layer and an electrode or electrodes, and is exemplified by those which have a simple structure such as a light-emitting element and a transistor, CPU, memories and processors having integrated thereon various operation circuits. As to the element structure, a number of the element structures are commonly formed on a wafer in a matrix state and are finally cut into individual chips, but a large one element structure may be formed on a wafer without being cut into smaller chips. The wafer may be a crystalline substrate capable of growing a semiconductor crystal layer such as a sapphire crystal for growing a GaN crystal as well as a semiconductor crystal such as Si or GaAs.

(Process for Producing a Semiconductor Wafer Having a Film)

Figure 2:
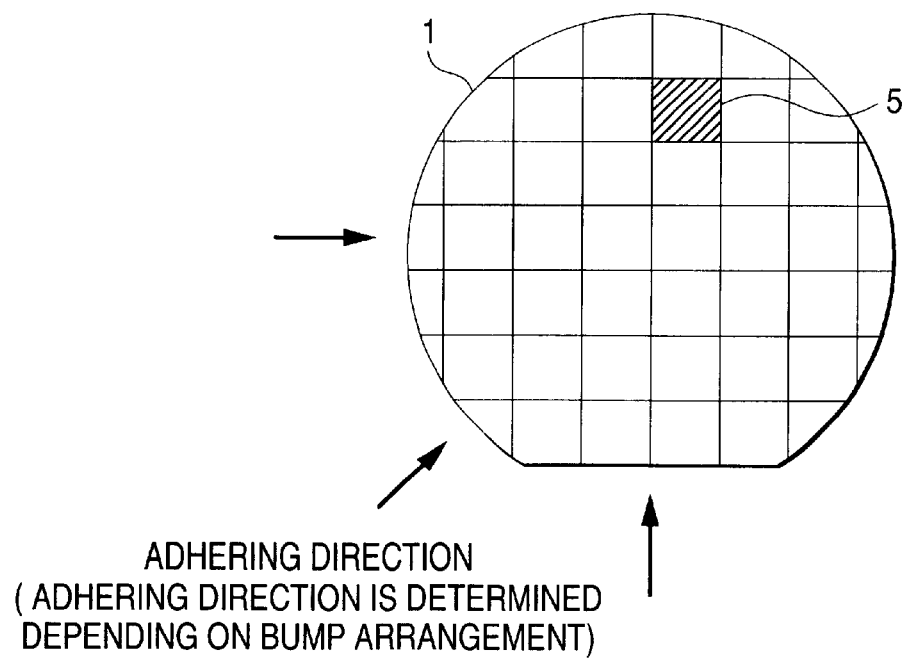
FIG. 2 is an outline plane view showing the manner of adhering an adhesive film to a semiconductor wafer.
Figure 3:
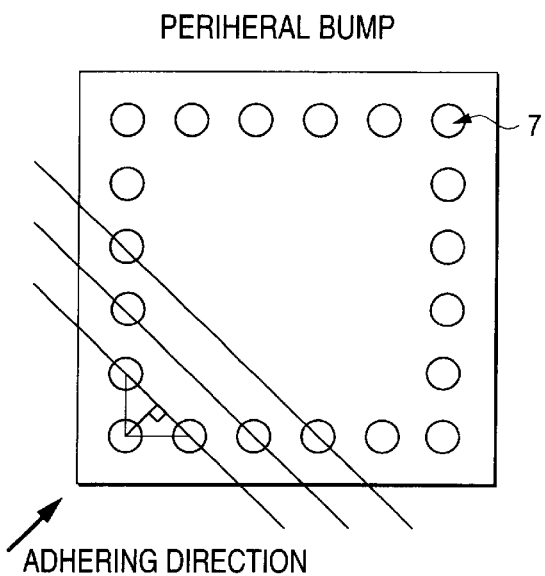
FIG. 3 is a plane view schematically showing a peripheral bump arrangement on a semiconductor wafer.
Figure 4:
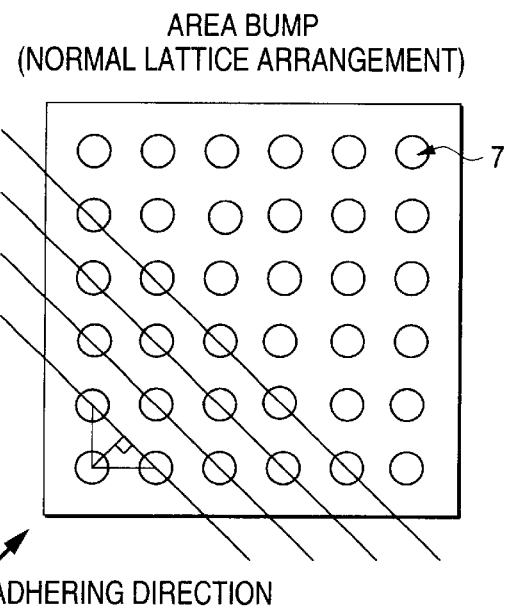
FIG. 4 is a plane view schematically showing the adhering direction for a normal lattice area bump arrangement.
Figure 5:
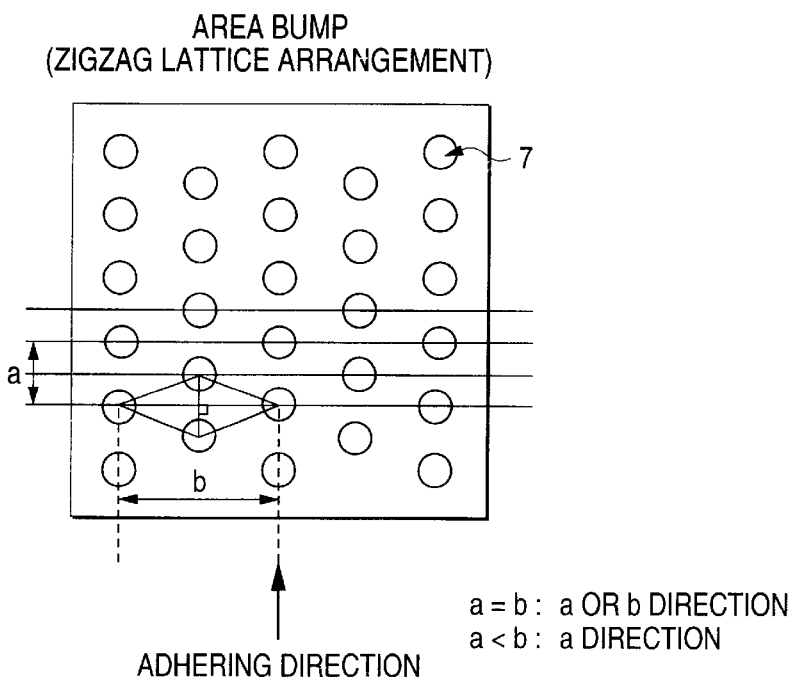
FIG. 5 is a plane view schematically showing the adhering direction for a zigzag lattice area bump arrangement.

One example of the process of the invention for producing a semiconductor wafer having an adhesive film for underfill is described below. FIG. 1 is a side-view of an outline illustration showing the manner of adhering an adhesive film to a semiconductor wafer, and FIG. 2 is an outline plane view showing the manner of adhering an adhesive film to a semiconductor wafer. Also, FIG. 3 is a plane view schematically showing a general peripheral bump arrangement on a semiconductor wafer. FIGS. 4 and 5 are plane views schematically showing area bumps in a normal lattice arrangement and area bumps in a zigzag lattice arrangement.

As is shown in FIGS. 1 and 2, an adhesive film 4 for underfill backed with a separator 3 is opposed to the circuit surface (upper surface) of a semiconductor wafer 1, and adhering of the adhesive film 4 for underfill is conducted by means of a adhering roller 6 migrating on the semiconductor surface 1 in a direction parallel to the wafer surface.

The direction of adhering the adhesive film for underfill is determined so that intervals between adjacent linear arrangement axes connecting the bumps become the shortest as shown in FIGS. 3 to 5. In the case where the bumps on the semiconductor wafer 1 are in a peripheral arrangement, the adhesive film is adhered at substantially a right angle with the oblique side of a right triangle drawn by connecting the bumps. Also, with area bumps, the adhesive film is adhered in a substantially diagonal line direction of the minimum four-sided figure in the bump arrangement. The term "direction at substantially a right angle" or "a substantially diagonal line direction" as used herein means a direction in the range of ±5° of each of the above-described directions. The adhering conducted in such direction serves to reduce the number of included bubbles. It is most preferred to adhere in just the right-angle direction or in just the diagonal line direction. Additionally, with the normal lattice area bumps, the adhering direction can also be defined as a direction at a right angle with the oblique side of a right triangle drawn by connecting the corner bump and two bumps adjacent thereto with respect to the outermost bump arrangement.

In addition, upon adhering, it is preferred to heat either the roller 6 or the semiconductor wafer 1, for example, on a hot plate 2. The heating temperature is not particularly limited and may properly be selected within a range where the adhesive film is tentatively adhered to the wafer. For example, in the case of an adhesive film for underfill using a polycarbodiimide resin composition, the heating temperature is preferably 40 to 180° C., more preferably 50 to 120° C.

As the bump arrangement on the semiconductor wafer employed in the production process of the invention, there are illustrated peripheral bumps as shown in FIG. 3, and area bumps having normal lattice and zigzag lattice, as shown in FIGS. 4 and 5, respectively.

Then, the semiconductor wafer 1 having the adhesive film for underfill is cut into chips by dicing with, preferably, adhering a pressure-sensitive adhesive tape to the backside of the wafer 1 to obtain individually cut chips having the adhesive film for underfill.

Then, this chip is mounted directly on a board with the side of the adhesive film for underfill facing the board, by using a flip-chip bonder or the like. Thus, electrical connection is established between the board and the chip. Subsequently, the adhesive film for underfill is heated to melt and cure it, thus the interface between the chip and the board being sealed to obtain a semiconductor device.

(Adhesive Film)

The adhesive film for underfill to be used in the invention can stick to a semiconductor wafer and is made of, for example, a thermosetting resin composition or a thermoplastic resin composition. In particular, in view of low melt viscosity and high heat resistance, a thermosetting resin composition is preferred.

As the thermosetting resin composition, there are illustrated a polyester resin, a polyamide resin, a polycarbodiimide resin, a phenoxy resin, an epoxy resin, an acrylic resin and a saturated polyester resin. Further, in view of preservability of film, a polycarbodiimide resin is more preferred. The polycarbodiimide resin to be contained in the polycarbodiimide resin composition is not particularly limited. As one example, polycarbodiimide and a process for its production are described below.

As the polycarbodiimide resin composition, an aromatic polycarbodiimide resin composition having a high heat resistance is preferred. Such polycarbodiimide is obtained by decarboxylation condensation of an aromatic diisocyanate using a known phosphorus-containing catalyst such as phosphorenoxides, e.g., 1-phenyl-2-phosphoren-1-oxide, 3-methyl-2-phosphoren-1-oxide, 1-ethyl-2-phosphoren-1-oxide, 3-methyl-1-phenyl-2-phosphoren-1-oxide and 3-phosphorene isomers thereof.

As the aforesaid aromatic diisocyanate, there are specifically illustrated 4,4'-diphenylmethanediisocyanate, 2,6-tolylenediisocyanate, 2,4-tolylenediisocyanate, 1-methoxyphenyl-2,4-diisocyanate, 3,3'-dimethoxy-4,4'-diphenylmethane diisocyanate, 4,4'-diphenyl ether diisocyanate, 3,3'-dimethyl-4,4'-diphenyl ether diisocyanate, 2,2-bis[4-(4-isoocyanatophenoxy)phenyl] hexafluoropropane, 2,2-bis[4-(4-isocyanatophenoxy)phenyl]propane, etc., with tolylenediisocyanate being particularly preferably used. Additionally, these diisocyanates may be used alone or as a mixture of two or more of them.

As a particularly preferred polycarbodiimide, there are illustrated polycarbodiimide copolymers represented by the following formula (I):

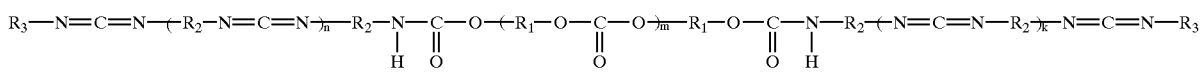

(I)

wherein k represents an integer of 0 to 30, m represents an integer of 2 to 100, n represents an integer of 0 to 30, $R_1$ represents an alkylene group containing 2 to 10 carbon atoms, $R_2$ represents an aromatic diisocyanate residue, and $R_3$ represents an aromatic monoidocyanate residue.

In producing the polycarbodiimide of the formula (I), preferably, a polycarbonate diol represented by the following general formula (II):

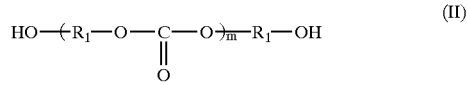

(II)

wherein m represents an integer of 2 to 100, and $R_1$ represents an alkylene group containing 2 to 10 carbon atoms, is reacted with the aromatic diisocyanate to obtain a polyurethane and, subsequently, carbodiimidation is conducted between the terminal isocyanate group and the aromatic diisocyanate in the presence of a carbodiimidation catalyst, followed by blocking the terminal group with an aromatic monoisocyanate to obtain the polycarbodiimide copolymer.

That is, 2 mols or more, preferably 4 to 80 mols, more preferably 5 to 50 mols of the aromatic diisocyanate is used per mol of the polycarbonate diol of the formula (II), and the reaction is conducted usually at 0 to 120° C., preferably 20 to 100° C., for about 1 minute to about 5 hours in the presence of a solvent. When there remain almost no hydroxyl groups in the system, the reaction of producing a polyurethane having NCO at both terminals is regarded to be completed.

Then, the resultant polyurethane and the aromatic diisocyanate existing in an excess amount are reacted with each other usually at 40 to 150° C., preferably 50 to 140° C., in the presence of a carbodiimidation catalyst. Blocking of the terminal group with an aromatic monoisocyanate is preferably conducted by adding the aromatic monoisocyanate at the initial, middle or last stage of, or throughout, the carbodiimidation. Thus, there is obtained a copolymer of the formula (I).

The amount of the aromatic diisocyanate necessary in the reaction is 2 mols or more per mol of the polycarbonate, and the aromatic diisocyanate may be additionally added at this reaction stage or may be allowed to exist from the initial stage of the reaction.

Completion of the reaction can be confirmed by observing an absorption of IR derived from carbodiimide group (2140 cm$^{-1}$) or disappearance of an absorption derived from isocyanate group.

(Polycarbonate Diol)

In the formula (II), $R_1$ represents an alkylene group containing 2 to 10 carbon atoms, such as ethylene, tetramethylene, hexamethylene or octamethylene group, and m represents an integer of 2 to 100, preferably 5 to 80.

It suffices for the polycarbonate diol to be a polycarbonate diol containing carbonate groups. Specific examples thereof include polyethylene carbonate diol, polytetramethylene carbonate diol, polyhexamethylene carbonate diol, polyoctamethylene carbonate diol and polydodecamethylene carbonate diol, with polyhexamethylene carbonate diol being particularly preferred. Additionally, these polycarbonate diols may be used independently or as a mixture of two or more of them.

(Aromatic Diisocyanate)

In the formula (II), $R_2$ represents an aromatic diisocyanate residue. As such $R_2$, there are illustrated, for example, a tolylenediisocyanate residue and a diphenylmethane diisocyanate residue, etc. k and n each independently represents an integer of 0 to 30, preferably 2 to 20.

Specific examples of the aromatic diisocyanate include 4,4'-diphenylmethane diisocyanate, 2,6-tolylenediisocyanate, 2,4-tolylenediisocyanate, 1-methoxyphenyl-2,4-diisocyanate, 3,3'-dimethoxy-4,4'-diphenylmethane diisoocyanate, 4,4'-diphenyl ether diisocyanate, 3,3'-dimethyl-4,4'-diphenyl ether diisocyanate, 2,2'-bis[4-(4-isocyanatophenoxy)phenyl] hexafluoropropane and 2,2-bis[4-(4-isocyanatophenoxy) phenylpropane. Of these, tolylenediisocyanate can particularly preferably be used. Additionally, these diisocyanates may be used alone or as a mixture of two or more of them.

(Aromatic Monoisocyanate)

As is described above, it is preferred in the invention to conduct the terminal-blocking treatment by adding the aromatic monoisocyanate. As the aromatic monoisocyanate to be used in the terminal-blocking treatment, there may specifically be used phenyl isocyanate, p-nitrophenyl isocyanate, p- and m-tolyl isocyanate, p-formylphenyl isocyanate and p-isopropylphenyl isocyanate. In particular, p-isopropylphenyl isocyanate is preferably used. A solution of the thus terminal-blocked polycarbodiimide copolymer is excellent in storage stability.

(Reaction)

The polymerization temperature is preferably 40 to 150° C. more preferably 50 to 140° C. In case where the reaction temperature is lower than 40° C., there results a prolonged reaction time, thus such temperature not being practical. On the other hand, reaction temperature exceeding 150° C. makes it difficult to select a proper solvent.

The concentration of diisocyanate monomer in the reaction solution is 5 to 80% by weight (hereinafter merely referred to as %). In case where the concentration is lower than 5%, the carbodiimidation reaction might not proceed. On the other hand, in case where the concentration exceeds 80%, control of the reaction might become difficult.

Solvents to be used for producing the polycarbodiimide and organic solvents to be used for the polycarbodiimide solution may be conventionally known ones. Specifically, there are illustrated halogenated hydrocarbons such as tetrachlotoethylene, 1,2-dichloroethane and chloroform, ketone solvents such as acetone, methyl ethyl ketone, methyl isobutyl ketone and cyclohexanone, cyclic ether solvents such as tetrahydrofuran and dioxane, and aromatic hydrocarbon solvents such as toluene and xylene. These solvents may be used alone or as a mixture of two or more of them.

As a catalyst to be used for carbodiimidation, any of known phosphorus-containing catalyst can preferably be used, and there are illustrated, for example, phosphorene oxides such as 1-phenyl-2-phosphorene-1-oxide, 3-methyl-2-phosphorene-1-oxide, 1-ethyl-2-phosphorene-1-oxide, 3-methyl-1-phenyl-2-phosphorene-1-oxide, and 3-phosphorene isomers thereof.

After completion of the copolymerization reaction, the reaction solution may be poured into a poor solvent such as methanol, ethanol, isopropyl alcohol or hexane to precipitate the polycarbodiimide copolymer and remove unreacted monomer and the catalyst.

In order to prepare a solution of the polycarbodiimide, the precipitated polymer is washed and dried in a given procedure, and again dissolved in an organic solvent. By conducting such procedure, solution stability of the polycarbodiimide can be improved.

Additionally, by-products contained in the polymer solution may be adsorbed with a proper adsorbent to purify. As the adsorbent, there may be used, for example, alumina gel, silica gel, activated carbon, activated bauxite, fuller's earth, activated clay and molecular seive carbon alone or in combination.

The average polymerization degree of the polycarbodiimide copolymer of the invention is 2 to 160, preferably 9 to 120. In case where the polymerization degree of the polycarbodiimide is higher than this, it easily gels upon being left for several minutes to several hours at an ordinary temperature, thus such polymerization degree not being preferred. In case where the polymerization degree is less than the aforesaid range, there results a lack of reliability of the film, thus such polymerization degree not being preferred.

(Production of Adhesive Film)

In order to produce the adhesive film for underfill of the invention, a varnish of the polycarbodiimide copolymer is formed into a film with a suitable thickness in a known manner (casting, spin coating or roll coating). The thus formed film is dried at a temperature commonly employed for removing a solvent. That is, the coating temperature is, for example, 20 to 350° C., preferably 50 to 250° C., most preferably 70 to 200° C. so as to dry without allowing the reaction to proceed too much. In case where the drying temperature is lower than 20° C., the solvent remains in the resultant film, which provides a poor reliability of the film, thus such drying temperature not being preferred. In case where the drying temperature is higher than 350° C., thermal setting is liable to proceed.

In producing the adhesive film, fine inorganic fillers may be compounded within the range of not spoiling its processability and heat resistance. In addition, various additives such as a smoothing agent a levelling agent and a defoaming agent may be added as demanded. These additives are compounded in an amount of 0.1 to 100 parts by weight, preferably 0.2 to 50 parts by weight, per 100 parts by weight of the copolymer.

In order to improve adhesion force, various additives such as a silane coupling agent, a titanium-containing coupling agent, a nonionic surfactant, a fluorine-containing surfactant and a silicone-based additive may be added to the adhesive film as demanded.

In producing the adhesive film, one, two or more of various inorganic powders comprising, for example, metals or alloys such as aluminum, copper, silver, gold, nickel, chromium, lead, tin, zinc, palladium and solder, ceramics such as alumina, silica, magnesia and silicon nitride, and carbon may be added as demanded in order to improve thermal conductivity and adjust modulus of elasticity.

The thickness of the adhesive film for underfill is not particularly limited, and may properly be selected within the range of filling the gap between the chip and the wiring circuit board and not inhibiting electrical connection between electrode portions for connection. Thus, the thickness is usually 5 to 200 $\mu$m, preferably 10 to 120 $\mu$m.

(Protection of Film)

The adhesive film for under fill to be used in the invention is preferably protected on its surface which has an adhesion to a wafer by a releasable film so that dust or the like does not adhere to the surface of the adhesive film before use and so as to reinforce the adhesive film which is difficult to convey due to its insufficient film strength as a single layer. As the releasable plastic film, those films may be used which can resist heat and pressure to be applied for adhering the adhesive film for underfill to the semiconductor wafer and which, upon delamination, can be delaminated with leaving thereon no adhesive film for underfill. As such film, there are illustrated those plastic films such as polyethylene terephthalate film polyester film polyvinyl chloride film, polycarbonate film and polyimide film which have been subjected to a treatment of imparting release characteristics using a known releasing agent such as silicone-based one, long-chain alkyl-containing one, fluorine-containing one, aliphatic amide-based one or a silica-based one. Alternatively, there may be used a fluorine-containing resin film such as a polytetrafluoroethylene film, a polypropylene film or a polyethylene film. The releasable plastic films are not limited as to the thickness, and a thickness of, for example, 10 to 200 $\mu$m is preferred, with a thickness of 20 to 150 $\mu$m being more preferred.

In the case of using the adhesive film for underfill protected on both sides thereof with the aforesaid releasable plastic film, the releasable film is delaminated from one side of the adhesive film, and the bare surface of the adhesive film may be adhered to the bump-formed surface of a semiconductor wafer using a laminater.

Additionally, the "adhesive film" to be used in the production process of the invention is not limited to the adhesive film for underfill, and may be other protective film having conventionally been adhered to a semiconductor wafer such as a protective film for a semiconductor wafer.

The area bumps to which the invention is applied are not limited to that as shown by FIG. 4 which are arranged in a lattice form parallel with, or perpendicularly with, one side of the conventionally widely used rectangular chip (normal lattice). As is different from this, as shown in FIG. 5, the area bumps may be in a zigzag lattice arrangement. With such area bump arrangement, the direction of adhering the adhesive film is a direction of the diagonal line of the minimum four-sided figure in the arrangement drawn by connecting bumps. When lengths of the diagonal lines, a and b, are equal (a=b), the adhering direction may be either of directions a and b and, where a<b, the number of included bubbles can be reduced by adhering in the direction a.

Next, the invention will be specifically described by reference to Examples of the process for producing the semiconductor wafer having an adhesive film for underfill which are embodiments of the invention and to Comparative Examples.

Production Example 1
(Production of Adhesive Film)

Tolylenediisocyanate (100 g, 0.57 mol) (Takenate; made by Takeda Chemical Industries, Ltd.), polyhexamethylene carbonate diol, UH-CARB100 (100 g, 0.10 mol) (made by UBE Industries, Ltd.), 75 g of xylene and 25 g of cyclohexanone were charged in a four-necked flask equipped with a stirrer, a dropping funnel, a reflux condenser and a thermometer, and urethanation was conducted at 100° C. for 3 hours.

After the temperature of the reaction solution came down to room temperature, a carbodiimidation catalyst (3-methyl-1-phenyl-2-phosphorene-1-oxide)(0.883 g; 4.59 mmol) and p-isopropylphenyl isocyanate (6.4793 g; 40.2 mmol) were charged therein, and the solution was stirred at 100 C. for 2 hours to conduct polymerization. Carbodiimidation was confirmed through an IR spectrum. The resultant polycarbodiimide copolymer had a number average molecular weight (Mn) of 6300.

The thus obtained varnish was applied to a separator (50 um thick) composed of a polyethylene terephthalate film having been surface-treated with a releasing agent, and heated at 150° C. for 3 minutes to obtain an adhesive film for underfill (thickness of the adhesive film: 50 $\mu$m).

EXAMPLE 1

The adhesive film for underfill obtained in Production Example 1 was adhered onto a semiconductor wafer by means of a laminater. Additionally, this semiconductor wafer was 6 inches in diameter, 300 $\mu$m in thickness, 50 $\mu$m in Au stud bump height, 90 $\mu$m in bump diameter, peripheral 91 bumps/chip and 200 $\mu$m in pitch.

Adhering of the film was conducted, as shown in FIGS. 1 and 2, by placing a semiconductor wafer 1 on a hot plate 2 heated to 120° C. and facing the adhesive film 4 for underfill backed with a separator 3. In the adhering procedure, the direction at a right angle with the oblique side of a right triangle drawn by connecting the corner bump and two bumps adjacent thereto with respect to the outermost bump arrangement of peripheral bumps 7 as shown in FIG. 3 was determined as the adhering direction, and the roller 6 of the laminator was allowed to migrate in this direction on the bumps 7-formed surface to obtain a semiconductor wafer having an adhesive film for underfill.

Measurement of the number of voids of 50 to 200 $\mu$m in diameter on the resultant semiconductor wafer having the adhesive film for underfill under a microscope revealed that the number of voids was 497/wafer.

The resultant semiconductor wafer having the adhesive film was subjected to dicing using a dicer (made by DISCO K.K.; DAD522) to obtain chips (8 mm□ (8 mm×8 mm)) having the adhesive film.

This chip having the adhesive film was adhered to a wiring circuit board (FPC 2-layer board; 18 $\mu$m in wiring height; L/S=100 um; 40 mm□×45 $\mu$m$^r$(40 mm×40 mm×45 $\mu$m)) using a flip-chip bonder (made by Shibuya Kogyo K.K.; DB100) under the conditions of 250 C. in adhering temperature, 2 MPa/chip in adhering pressure, and 30 s in adhering time to thereby heat-melt and cure the adhesive film and establish an electrical connection between the bumps of the chip and the electrodes of the board, thus 10 semiconductor devices being obtained.

The resultant cured product of the adhesive film for underfill had the following physical properties. Additionally, curing conditions were 150° C. in temperature and 60 minutes in time.

TABLE 1

Properties of the adhesive film for underfill

| Test Item | Unit | Polycarbodiimide |
| --- | --- | --- |
| Tg | ° C. | 120 |
| Coefficient of linear expansion | ppm | 177 |
| Modulus of elasticity | MPa | 17 |
| Dielectric constant |  | 3.6 |
| Water absorption | wt % | 0.4 |
| 5% Weight loss temperature | ° C. | 330 |
| Analysis of impurity | ppm | Cl 7.09, Na 0.27 |

Comparative Example 1

The same procedures as in Example 1 were conducted using the same adhesive film for underfill and the same semiconductor wafer as in Example 1 as shown in FIG. 3 except for changing the adhering direction of the adhesive film for underfill to a direction parallel with, or perpendicularly with, the side of the four-sided figure which the outermost bumps of peripheral bumps 7 form to thereby obtain a semiconductor wafer having an adhesive film for underfill. Measurement of the number of voids of 50 to 200 $\mu$m in diameter on the resultant semiconductor wafer having the adhesive film for underfill revealed that the number of voids was 2322/wafer (observation under a microscope).

Also, a chip having the adhesive film were prepared from the semiconductor wafer having the adhesive film in the same manner as in Example 1, and the chip was mounted on a wiring circuit board under the same conditions as in Example 1. Thus, 10 semiconductor devices were obtained.

The semiconductor devices obtained in Example 1 and Comparative Example 1 were subjected to an initial electrical conductive test (whole bump-on test) at 25° C. The results thus obtained are shown in Table 2.

TABLE 2

|  | Example 1 | Comparative Example 1 |
|---|---|---|
| Initial electrical conductive test (number of non-conductive devices/10 devices) | 0/10 | 5/10 |
| Average connection resistance per terminal (mΩ) | 1.5 | 110 |

The results shown in Table 2 reveals that the semiconductor devices obtained in Example 1 caused no electrical conductive failure in the initial electrical conductive test. In contrast, the semiconductor devices obtained in Comparative Example 1 showed some electrical conductive failure in the initial electrical conductive test. In addition, the semiconductor device obtained in Comparative Example 1 and showing no electrical conductive failure was found to have an extremely higher value of average connection resistance per terminal.

Accordingly, it is apparent that the semiconductor devices obtained in Example 1 secured a stable initial electrical connection.

According to the invention, in the process of producing a semiconductor wafer having an adhesive film by adhering an adhesive film onto the bumps-formed surface of a wafer having formed thereon bumps, void inclusion can remarkably be reduced, with peripheral bumps or normal lattice bumps, by adhering the adhesive film onto the water in the direction at a right angle with the oblique side of a right triangle drawn by connecting the corner bump and two bumps adjacent thereto with respect to the outermost bump arrangement and, with the area bumps, by adhering in the direction of the diagonal line of the minimum four-sided figure in the arrangement of the bumps, using a laminator. Therefore, connection between the bumps and the board electrodes of a semiconductor device is not prevented, thus a stable electrical connection being attained.

This application is based on Japanese patent applications JP2001-221735, filed Jun. 22, 2001, and JP2002-123903, filed on Apr. 25, 2002, the entire contents of each of which are hereby incorporated by reference, the same as if set forth at length.

What is claimed is:

1. A process for producing a semiconductor wafer having an adhesive film, by adhering an adhesive film onto a bump-formed surface of a semiconductor wafer having formed thereon bumps with a predetermined arrangement, which comprises:

determining a particular arrangement axis direction in which intervals between adjacent linear arrangement axes connecting the bumps becomes the shortest; and adhering the adhesive film in the direction substantially at a right angle with the determined arrangement axis direction.

2. The process for producing a semiconductor wafer having an adhesive film according to claim 1, wherein the bumps are in a peripheral arrangement, and the adhering is conducted in a direction at a right angle with the oblique side of a right triangle drawn by connecting the corner bump and two bumps adjacent thereto with respect to the outermost bump arrangement.

3. The process for producing a semiconductor wafer having an adhesive film according to claim 1, wherein the bumps are in a normal lattice area arrangement, and the adhering is conducted in a direction at a right angle with the oblique side of a right triangle drawn by connecting the corner bump and two bumps adjacent thereto with respect to the outermost bump arrangement.

4. The process for producing a semiconductor wafer having an adhesive film according to claim 1, wherein the bumps are in a zigzag lattice area arrangement, and the adhering is conducted in a direction of the shorter diagonal line of the minimum four-sided figure in the arrangement.

5. The process for producing a semiconductor wafer having an adhesive film according to claim 1, wherein the adhesive film comprises a thermosetting resin composition.

6. The process for producing a semiconductor wafer having an adhesive film according to claim 5, wherein the adhesive film comprises a polycarbodiimide resin composition.

7. The process for producing a semiconductor wafer having an adhesive film according to claim 6, wherein the polycarbodiimide resin composition is a polycarbodiimide copolymer represented by formula (I):

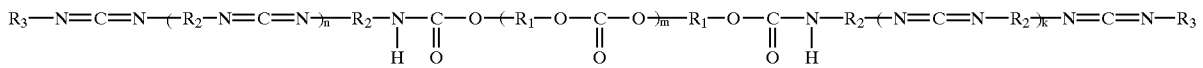

wherein k represents an integer of 0 to 30, m represents an integer of 2 to 100, n represents an integer of 0 to 30, $R_1$ represents an alkylene group containing 2 to 10 carbon atoms, $R_2$ represents an aromatic diisocyanate residue, and $R_3$ represents an aromatic monoidocyanate residue.

8. The process for producing a semiconductor wafer having an adhesive film according to claim 6, wherein the adhering is carried out by heating at 40° C. to 180° C.

9. A process for producing a chip having an adhesive film, which comprises dicing the semiconductor wafer having an adhesive film produced by the process according to claim 1.

10. A process for producing a semiconductor device, which comprises mounting a chip on a circuit board by using as an underfill the adhesive film of the chip having the adhesive film produced by the process according to claim 9.

* * * * *